United States Patent [19]
Swift

[11] Patent Number: 5,177,844
[45] Date of Patent: Jan. 12, 1993

[54] PLACEMENT DEVICE FOR ELECTRONIC COMPONENTS

[76] Inventor: James C. Swift, 12145 Walnut, Olathe, Kans. 66061

[21] Appl. No.: 821,460

[22] Filed: Jan. 15, 1992

[51] Int. Cl.$^5$ .................. H05K 13/04; B23P 19/00
[52] U.S. Cl. ................................ 29/721; 29/740; 29/759
[58] Field of Search ............ 29/740, 741, 739, 759, 29/721

[56] References Cited

U.S. PATENT DOCUMENTS

4,573,263   3/1986   DeRossi .................. 29/741

*Primary Examiner*—Carl E. Hall
*Attorney, Agent, or Firm*—James J. Leary

[57] ABSTRACT

A hand-operated device for the precise positioning of electronic components on a printed circuit board (PCB) to assist in the assembly, repair or rework of PCB's. The device has a base ring with three adjustable-length legs which rest on or straddle the PCB. An x-ring is slidably mounted to the base ring and is moved in the direction of the x-axis by an actuator. A y-ring is slidably mounted to the x-ring and is moved in the direction of the y-axis by an actuator. A θ-ring is removably mounted on the y-ring and can rotate about the z-axis. A hub, which houses the z-actuator, is supported within the θ-ring by one or more arms. A grasping device, such as a vacuum gripper, is mounted on the z-actuator. In use, the device is positioned over a bonding site on the PCB, and the z-θ assembly is lifted off of the x-y base. An electronic component, such as an integrated circuit (IC), is picked up with the vacuum gripper and the z-θ assembly is replaced on the x-y base. The position of the IC is adjusted with the x- and y-actuators and the orientation is adjusted by rotating the θ-ring so that it is precisely positioned over the bonding site. The IC is then lowered onto the bonding site and released. The device is also adaptable to hold optical devices and processing tools, such as soldering or desoldering tools.

8 Claims, 5 Drawing Sheets

PLACEMENT DEVICE FOR ELECTRONIC COMPONENTS

FIELD OF THE INVENTION

This invention relates to a hand operated device for placing small components in assemblies. More particularly it relates to a device for the accurate placement of electronic components and devices on a printed circuit board.

BACKGROUND OF THE INVENTION

There are many circumstances under which the manual assembly of electronic circuits may be necessary or desirable. This is especially true of low volume operations where automated assembly equipment is unavailable or not economically justified. Such circumstances may include low volume manufacturing, prototyping, repair, rework or revision of electronic circuits.

In recent years there has been a trend toward the use of smaller and smaller electronic components. This has been especially true since the introduction of the technology of surface mounted devices. While these new technologies present significant economies in high volume automated production, they have made the hand assembly of circuits more difficult and time consuming and therefore more costly. Moreover these smaller components require more careful and accurate placement on the circuit board that is difficult to achieve by hand assembly. In addition, direct manual manipulation of these smaller devices may cause unacceptable mechanical deformation of the leads or contamination of the contact points which would interfere with their attachment by solder or adhesives.

A number of implements have been devised to aid in the manual assembly of electronic circuits. Most of these implements can be categorized as either hand tools or assembly workstations.

The hand tool category consists mostly of grasping devices to aid in the holding and manipulation of the electronic components. Simple hand tools such as pliers or tweezers allow the user to more easily hold small components without direct manual contact. This effectively eliminates the problems of contamination associated with direct hand contact, but it does little to improve the accuracy of component placement. In fact, much of the time these tools actually reduce the accuracy of placement because any small movement of the hand is amplified by the length of the tool. Orientation of the component and correct alignment of the contact pins or pads on the component with the pads on the circuit board is still difficult with the hand tools. It often involves a tedious trial and error process to correctly place the component on the circuit board.

Another group of hand tools involves vacuum operated grasping devices. Using a vacuum to hold the components effectively reduces contamination and component damage. However, it does not solve the problems of accuracy since it still depends on the accuracy and steadiness of the user's hand for placement of the components. These devices also introduce another complication associated with the release mechanism. Most vacuum graspers have a finger-operated release mechanism on the device. Operating the release can cause movement of the tool at the precise moment of release, undoing the operator's painstaking efforts to accurately place the component. Using a foot switch to operate the vacuum release avoids the problem of hand of movement during release, but it introduces an imprecise delay in the release timing which can adversely affect placement accuracy.

Assembly workstations are another approach for assisting the hand assembly of printed circuit boards. Workstations generally have a device for holding the printed circuit board and a device for assisting placement of the electronic components. Some workstations may also include other functions such as component storage, vision enhancements and soldering, heating or other process capabilities. At the very high end, the workstations may incorporate servo position controls, and even programmable assembly controllers, making them essentially into an automated assembly robot.

The simplest of these workstations assist the hand placement of electronic components. The printed circuit board is held in a rack which adjusts to the size of the board. The operator's forearm rests on an aluminum plate which moves in the x-direction on rails above the circuit board. The operator uses hand tools such as a vacuum gripper to place the electronic components on the board while his or her hand is steadied by the aluminum armrest. There is no control of the $\theta$ orientation of the components. While this approach facilitates repeated movement by organizing the workplace, the contribution to improving accuracy is minimal.

A more sophisticated manual workstation from OK Industries, eliminates the need for the operator to handle the components. The printed circuit board is held in a rack which adjusts to the size of the board. Components are stored in special component bins built into the workstation. A built-in vacuum gripper moves on rails in the x- and y-directions above the circuit board. The x- and y-positions of the gripper are controlled by hand and the z-position and the $\theta$-rotation are manually controlled through servo mechanisms. This allows for placement of electronic components under manual control, but still depends on the operator's hand for steadiness and accuracy.

Positioning tables are another approach to workstations where the circuit board moves on an x-y table beneath a stationary component holder. This approach has the advantage of high accuracy, but it is not well suited to aiding hand assembly as positioning tables are generally large and expensive and they obscure the work from view impeding manual control.

Within the range of workstations there are many tradeoffs between placement accuracy, expense, speed, ease of use and space required. In general, they are very expensive because they must be built with painstaking precision to maintain close tolerances of component positioning over the entire surface of the PCB. Often, special training is needed to operate the workstation. These combined factors often work together to force a facility to get by with a single workstation which must serve for all assembly and repair operations. This causes inconsistencies and inefficiencies in the work flow.

Though they are more effective than hand tools, workstations like these are also much larger and more expensive. This leaves a large gap between the inexpensive, but ineffective, hand tools and the expensive workstations. Very few devices have been proposed to fill this gap to provide an accurate, but lower cost method for placing components on a printed circuit board. U.S. Pat. No. 4,956,911 to Zaremba and Bayer proposes a tool for repairing surface mounted components on printed circuit boards. This device has a pair of L- shaped legs that rest on the printed circuit board and a vacuum mechanism on a plunger that moves in the z-direction. The position of the component is adjusted by contact with locating cams mount on the legs of the device. This device has limitations in that it provides adjustment of the component position only for the z-axis and $\theta$-angle. The x- and y-positions can only be corrected by moving the entire device, and there are no means to adjust the $\alpha$- and $\beta$-angles to assure that the component and the printed circuit board are coplanar.

OBJECTS OF THE INVENTION

In accordance with the foregoing discussion, the objective of the present invention is to provide a hand-operated device that allows precise placement of electronic components on a printed circuit board. The device must provide the accuracy of placement, repeatability and steadiness necessary for positioning miniaturized components that is not provided by hand assembly. At the same time, the device must be smaller, more portable and less cost than assembly workstations or automatic assembly robots. The device should be usable on any printed circuit board, regardless of size or shape. The device should also be easy to use with no special training required for its operation. In keeping with these objectives, the device must have a grasping means for picking up components without hand contact that might damage or contaminate the delicate electrical leads. It must allow adjustment of the position and orientation of the component by fine increments in three orthogonal translation axes and three rotational angles. The device must also provide a clear, unobstructed view of the component that is being worked on. A component placement device made according to these objectives would be useful for assembling small quantities of printed circuit boards or performing repairs or upgrades on circuit boards. The low cost would allow each repair technician or assembly operator in a facility to have their own device eliminating the inconveniences of having one central workstation. The small size and portability would make the device useful for performing field repairs on printed circuit boards so they would not have to be sent to a repair facility.

DESCRIPTION OF THE PREFERRED EMBODIMENT

Figure 1:
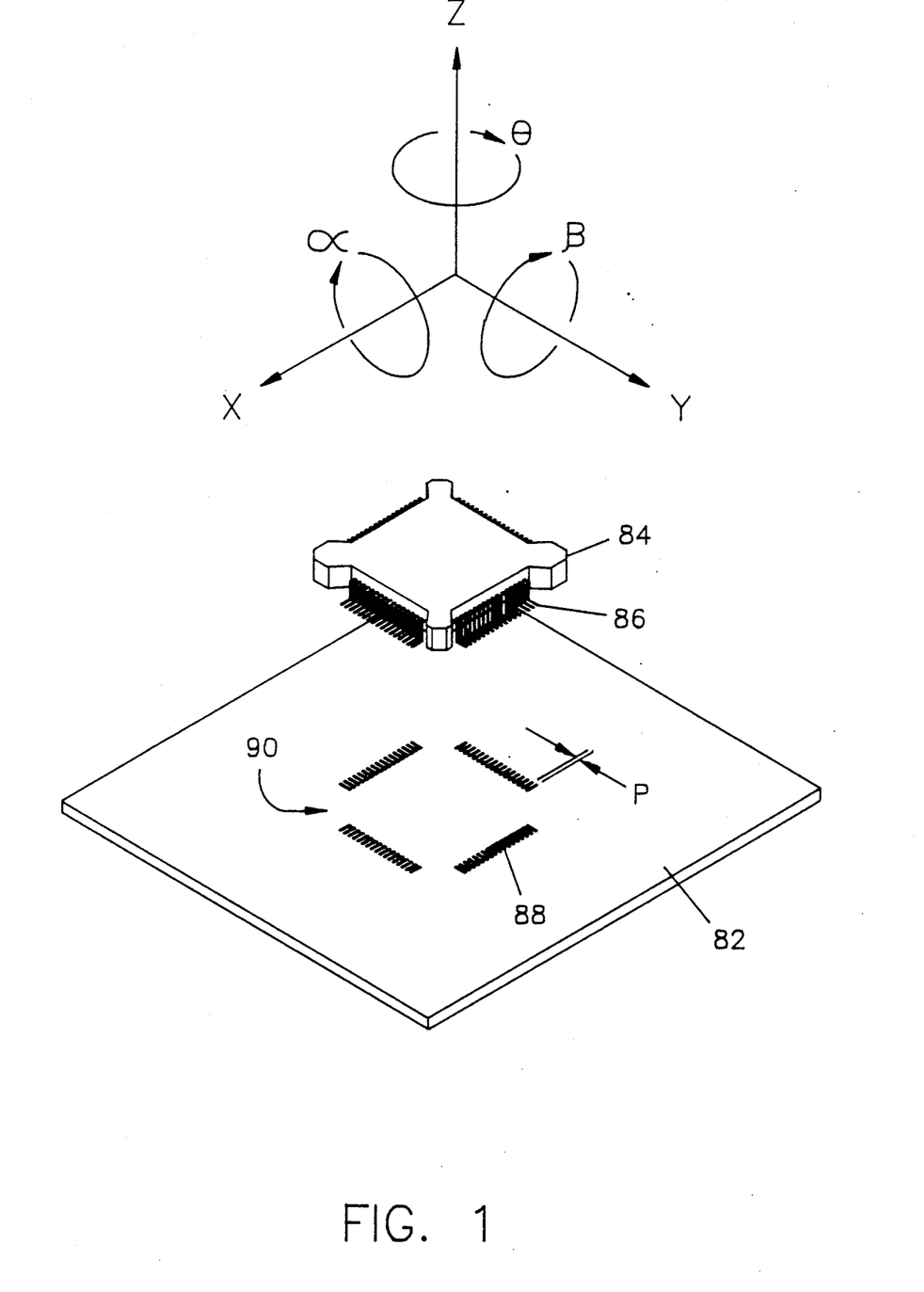
FIG. 1 show an integrated circuit chip and the axes that must be controlled for accurate positioning on the printed circuit board.

FIG. 1 shows an integrated circuit 84, also known as an IC or a chip, which is a typical circuit component that would be used with the component placement device. The device may also be used with resistors, capacitors, diodes, transistors, solder placement or any number of other electronic or mechanical components.

The drawings also shows a printed circuit board 82, sometimes referred to as a PC or PCB, which has on it one bonding site 90 for an integrated circuit. Typically, a real printed circuit board could have hundreds or even thousands of bonding sites for different components of the circuit. The bonding site 90 is made up of a number of bonding pads 88 which are electrical contacts that correspond with each one of the electrical contacts 86 on the component, in this case an integrated circuit 84. The electrical contacts 86 on the IC are known as leads, pins or bond pads. The letter P in the drawing designates the "pitch" or the center-to-center distance between the bonding pads 88 on the PCB 82. The smaller the pitch, the more accurately the component 84 must be placed on the bonding site 90 to ensure that each lead 86 makes contact with the correct bonding pad 88 and no others.

All of the contact pins or pads 86 of the component must be correctly aligned with the corresponding contact pads 88 on the printed circuit board 82 to assure proper electrical contact without open circuits or short circuits. Components and printed circuit boards made with a 20 mil pitch (20 thousandths of an inch center-to-center distance between contact pads) require components to be placed with an accuracy of plus or minus a few thousandths of an inch, which is very difficult with the unaided human hand. As more and more surface mount components are being made with a 10 mil pitch, requiring even more accuracy, unaided hand assembly and repair of printed circuit boards clearly becomes unfeasible.

Above the PCB 82 and integrated circuit 84 are illustrated the six degrees of freedom that must be controlled for precise placement of the component. These include three translational axes, the x-, y- and z-axes, and three rotational angles, the $\alpha$-, $\beta$- and $\theta$-angles. The x and y axes determine the component's position on the PCB, and the z-axis determines the height of the component above the surface of the PCB. The rotational angles determine the orientation of the component with respect to the bonding site on the PCB. The $\alpha$- and $\beta$-angles determine whether the component is coplanar with the bonding site so that each lead makes contact with its bonding pad at the same time when it is lowered onto the board. The $\theta$-angle determines the component's rotational orientation about the z-axis which is important so that each lead will make contact with its bonding pad.

Figure 2:
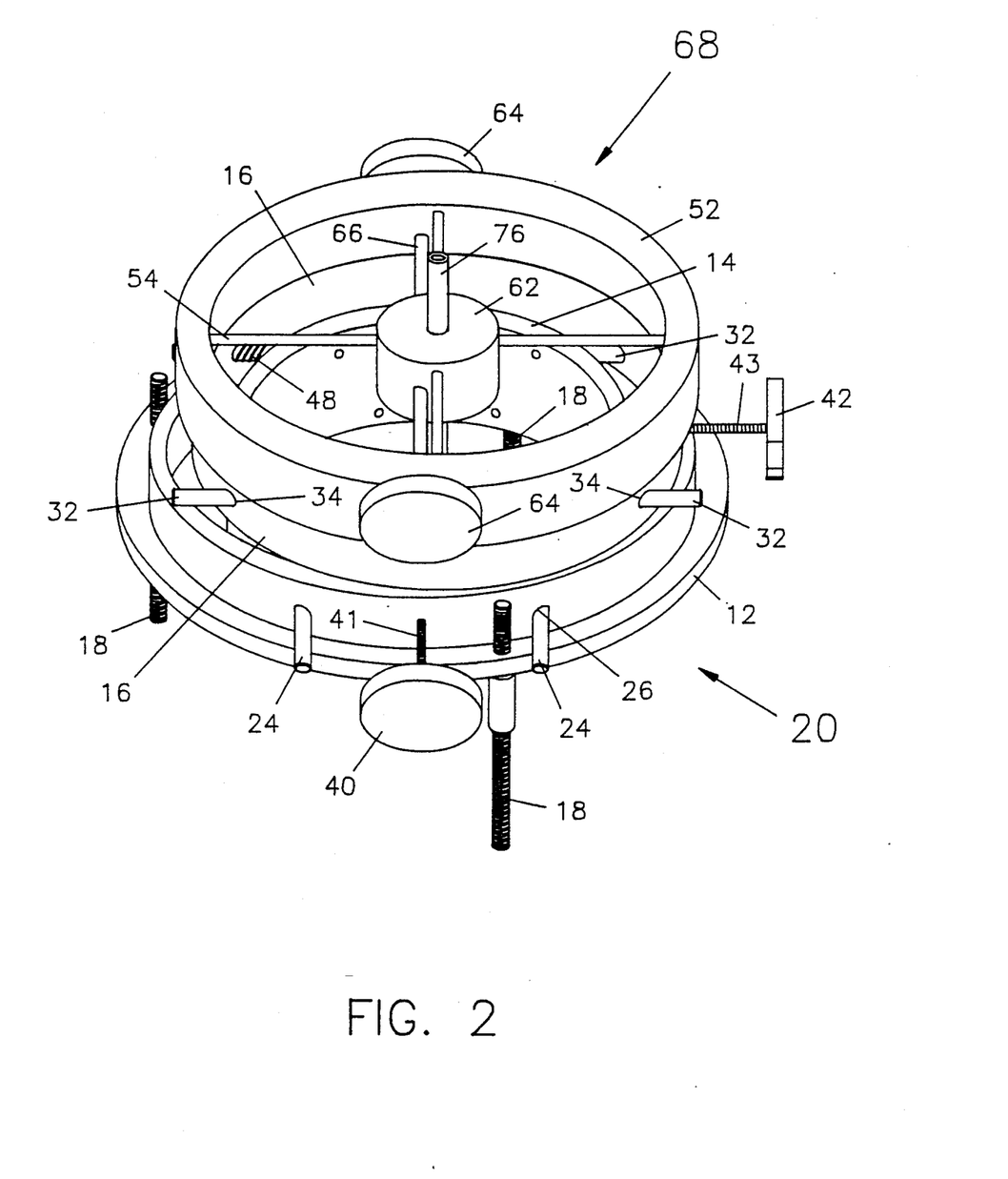
FIG. 2 shows the component placement device.
Figure 3:
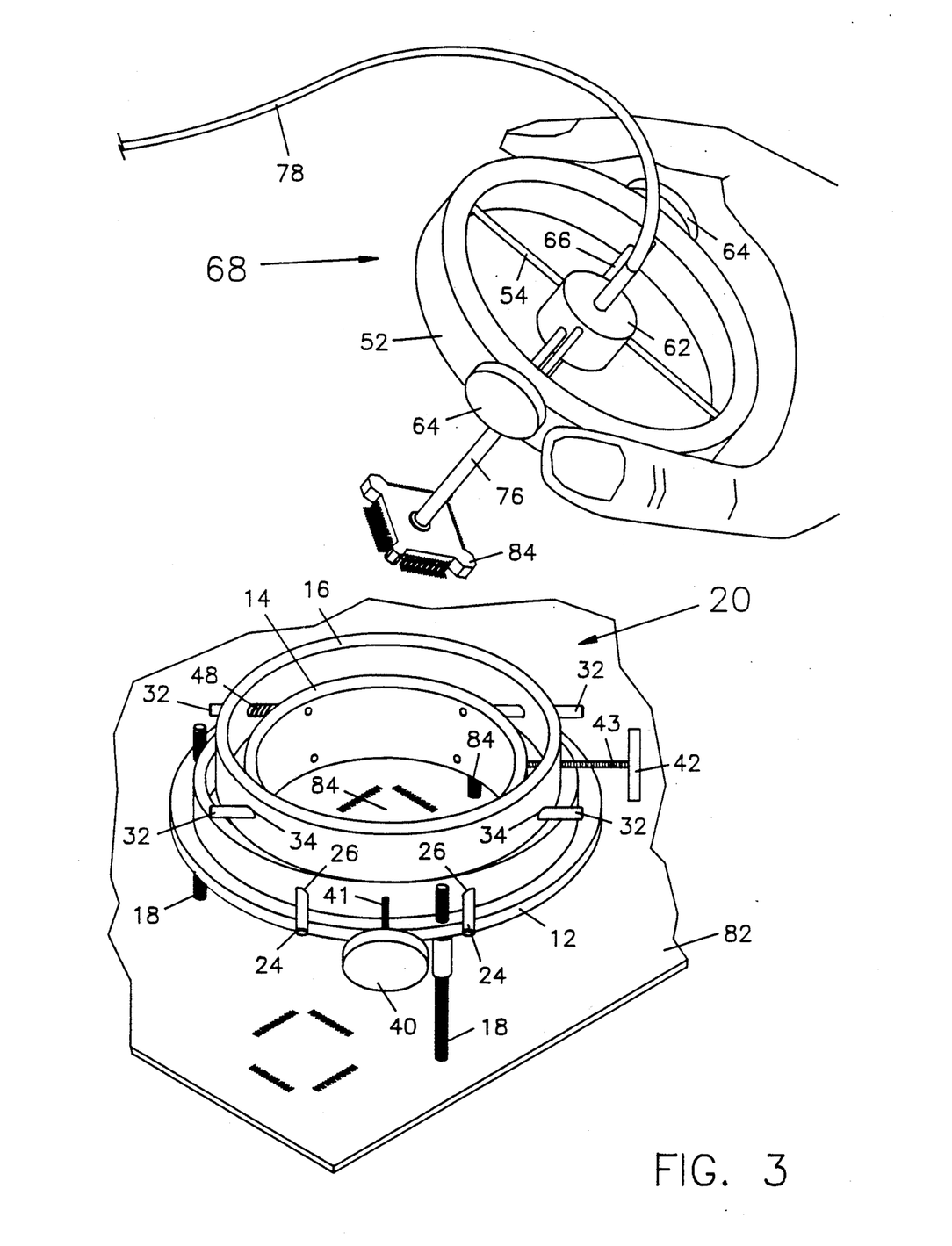
FIG. 3 shows the component placement device in use, with the $z\theta$ assembly separated from the base.

FIG. 2 shows the entire component placement device in a perspective view. There are individual adjustments for each of the axes. The x-, y- and z-axes are controlled by the x-, y- and z-knobs 40, 42, 64 respectively. The $\alpha$-and $\beta$-angles are controlled by screwing one or more of the three adjustable legs 18 into or out of the base ring 12 to change their relative heights. The $\theta$-angle is controlled by rotating the $\theta$-ring 52 with respect to the entire base 20. As shown in FIG. 3, the device is separable into two assemblies the $z\theta$ assembly and the x-y base or, simply, the base 20.

Figure 4:
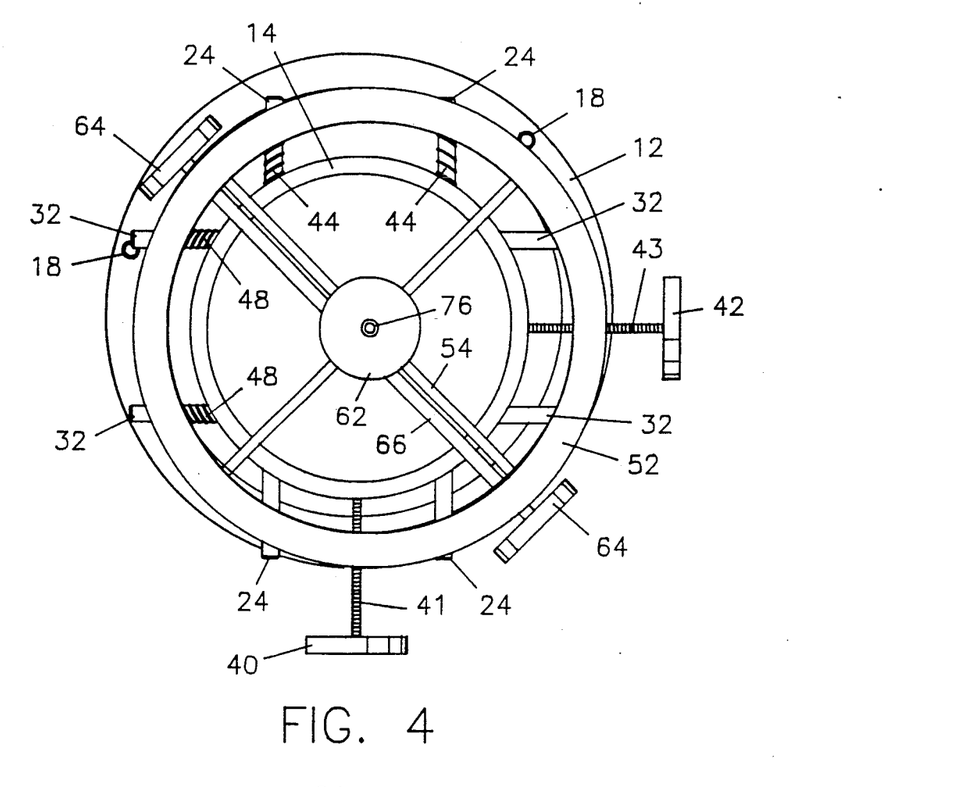
FIG. 4 shows a top view of the component placement device.
Figure 5:
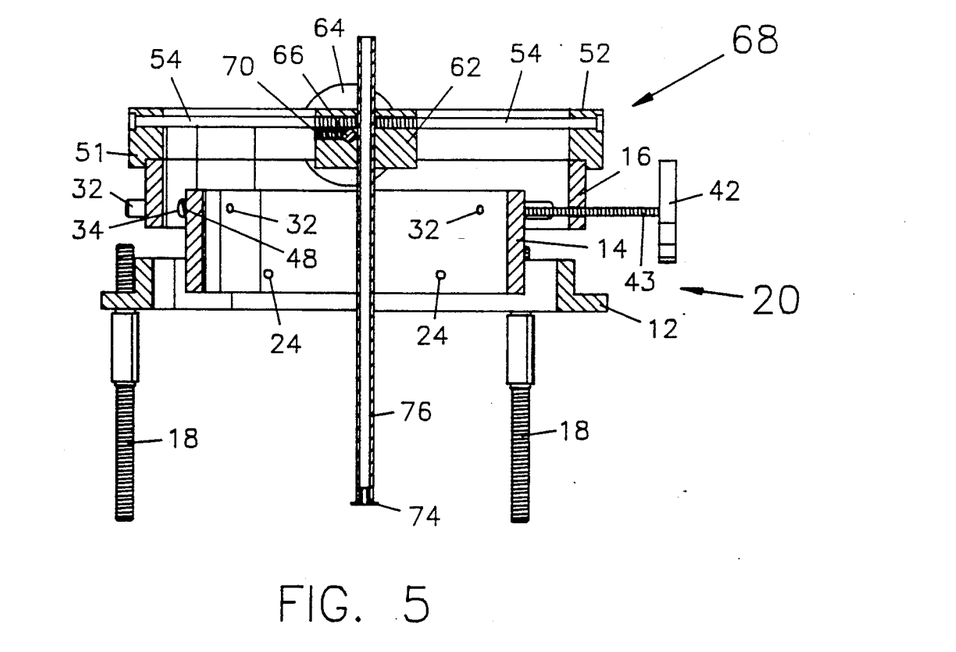
FIG. 5 shows a cross section of the component placement device.

For the more detailed description which follows please refer to FIGS. 4 and 5. The base 20 is made up of three rings. The base ring 12 has three adjustable legs 18 which extend downward from the base 20. The length of the legs 18 is made adjustable by threading them into holes in the base ring 12 so that they may be screwed into or out of the base ring 12. Other means may be used to make the legs 18 adjustable. For instance, there may be a threaded nut on the base ring 12 which may be turned to adjust the height of each threaded leg 18, or if the legs 18 are not threaded, a releasable collet or clamp on the base ring 12 may be used to allow each leg 18 to slide up and down. Changing the respective lengths of the legs 18 controls the rotation of the base about the $\alpha$- and $\beta$-angles so that the base 20 and therefore the component 84 can be made coplanar with the bonding site 90. The adjustable legs 18 also allow one or more of the legs to be shortened so that a leg can sit on top of another component and not unlevel the device in case there is not a clear footing on the PCB 82 for all of three of the legs 18.

Figure 7:
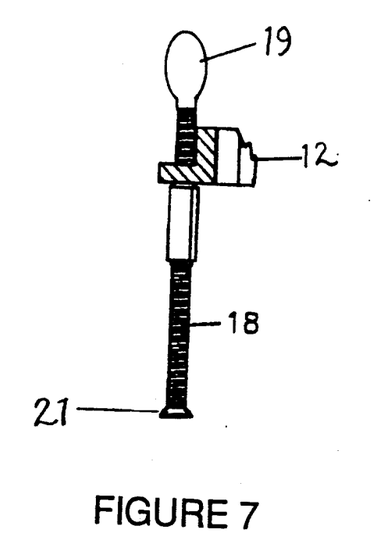
FIG. 7 shows an embodiment of the adjustable legs incorporating a vacuum gripping device.

In another embodiment of the device, some or all of the legs 18 may be provided with a vacuum mechanism 19, as shown in FIG. 7, that serves to hold the device in place on the PCB and prevents it from moving during use. For this embodiment, the legs 18 would be made hollow and have flexible suction tips 21 at the lower ends. The upper ends of the legs 18 would be attached to a vacuum source 19 such as a squeeze bulb or a hose from a vacuum pump.

The x-ring 14 is mounted to the base ring 12 by two pairs of cylindrical rails 24 which are parallel to the x-axis. These x-rails 24 are attached to the x-ring 14 and pass through holes 26 with a sliding clearance in the base ring 12. The x-ring 14 is moved in the positive x-direction by turning the x-knob 40 to turn the x-screw 41 which is threaded to the base ring 12 and bears on the x-ring 14. One or more springs 44 are provided to bias the x-ring 14 against the x-screw 41 and to move the x-ring 14 in the negative x-direction when the screw 41 is turned in the opposite direction.

The y-ring 16 is, in turn, mounted to the x-ring 14 by two more pairs of cylindrical rails 32 which are parallel to the y-axis. These y-rails 32 are attached to the x-ring 14 and pass through holes 34 with a sliding clearance in the y-ring. The y-ring 16 is moved in the positive y-direction by turning the y-knob 42 to turn the y-screw 43 which is threaded to the y-ring 16 and bears on the x-ring 14. One or more springs 48 are provided to bias the y-ring 16 against the y-screw 43 and to move the y-ring 16 in the negative y-direction when the screw 43 is turned in the opposite direction. In the presently preferred embodiment the x- and y-screws 41, 43 are standard fine pitch screws which gives enough precision for placement of most components. For applications where more precision is needed or desired, the x- and y-screws 41, 43 may be replaced with custom-made screws that will give a precise amount of travel for each degree of rotation or they may be replaced with micrometer actuators to measure the actual x- and y-travel.

The $z\theta$ assembly 68 rests on top of the base 20. The $\theta$-ring 52 rests on the y-ring 16 and is free to rotate about the $\theta$-axis. A ridge 51 around the underside of the $\theta$-ring 52 fits with a minimal sliding clearance around the y-ring 16 so that whenever the $z\theta$ assembly 69 is lifted off, then returned to the base 20 the component 84 is returned to the same position with only minor adjustments needed for precise alignment. A hub 62 is mounted near the center of the $\theta$-ring 52 by the support arms 54 which connect the hub 62 to the $\theta$-ring 52. In the preferred embodiment, there are four support arms 54, although other embodiments may have from one to several arms 54. The hub 62 has a vertical hole through the center that coincides with the z-axis. The pickup tube 76 passes through the hole with minimal sliding clearance. In use, the upper end of the pickup tube 76 will be attached to a vacuum source which may be a squeeze bulb or a hose from a vacuum pump 78. The lower end of the pickup tube 76 has a flexible suction tip 74 that forms a seal against the surface of a component so that it can be picked up when the vacuum is activated. The pickup tube 76 is moved up and down by the z-actuator 66. In the preferred embodiment, the z-actuator 66 is a friction drive with a rod 66 which passes horizontally through a hole in the hub 62. The pickup tube 76 rides in a notch in the rod 66. One or more set screws 70 may be provided in the hub 62 to make the rod 66 bear against the pickup tube 76. When the z-knob 64 is turned, it turns the rod 66 which raises or lowers the pickup tube 76. Preferably, there is enough friction in the drive so that the pickup tube 76 and the component 84 stay at the same height, and do not fall or drift down, unless they are deliberately moved by turning the z-knob 64. In other embodiments, the z-actuator 66 might be a rack-and-pinion drive or other linear actuator rather than a friction drive.

Other tools or accessories may be adapted to be used with the component placement device. A magnifying lens, microscope, light, video camera or other optical components may be adapted to be mounted on or above the device to help the operator to view the components on the PC board. Other tools such as soldering irons, hot air sources, IR soldering tools, UV adhesive curing tools and solder paste printing or stenciling apparati may be adapted to mount onto or in place of the $z\theta$ assembly. Where appropriate, other grasping mechanisms may be substituted for the vacuum gripper in the $z\theta$ assembly. This would allow these tools to be precisely positioned over components on the PC board during repair or assembly operations.

Figure 6:
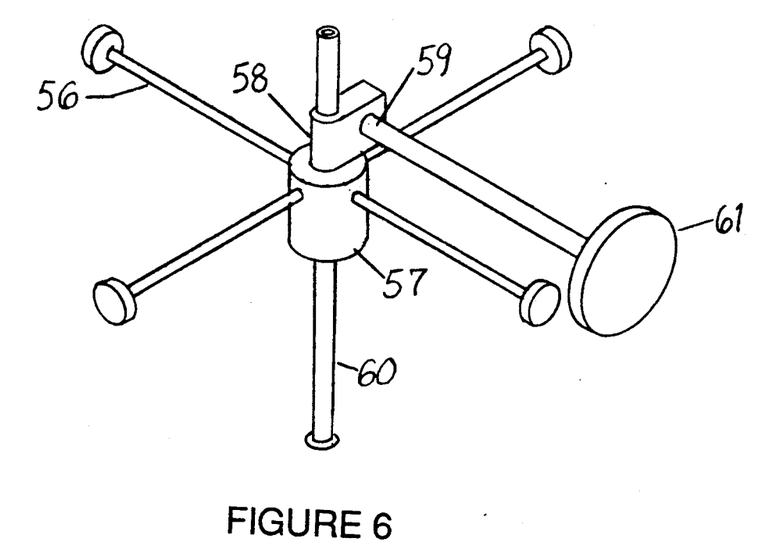
FIG. 6 shows an alternate embodiment of the $z\theta$ assembly.

An alternate embodiment of the $z\theta$ assembly is shown in FIG. 6. This embodiment incorporates the same functions as the preferred embodiment in a different configuration. The $\theta$-ring with its supporting arms has been replaced by a spider 56 with at least three legs extending from a central hub 57. The legs fit into corresponding notches in the top of the y-ring (not shown) to hold it in place and to assure repeatability in positioning. The $\theta$-rotation is provided by a $\theta$-bearing 58 which rotates on the central hub 57. Rotation of the z-knob 61 controls the z-actuator 59 which moves the pickup tube 60 up and down, while the position of z-knob 61 controls the $\theta$-angle.

The material for the preferred embodiment of the device is brass, chosen for its ease of machining, resistance to corrosion and its electrical conductivity. The electrical conductivity is a desired feature because it prevents the buildup of static electricity in the device, which might cause damage if it discharges into the component or the PCB. A variety of other materials such as stainless steel, aluminum or even structural plastics might also be utilized for some or all of the parts.

OPERATION

One important use of the component placement device is in replacing a defective component on a printed circuit board. Please refer to FIG. 3 for an understanding of this procedure. The procedure described may be modified for other uses such as the assembly of new circuit boards or the repair of a misaligned or improperly bonded component. To perform the repair, the component placement device 20, 68, which has been connected to a vacuum source 78, is placed on the printed circuit board 82 with the component 84 to be removed near the center of the device. If necessary, the α- and β-angles are adjusted by screwing one or more of the adjustable legs 18 into or out of the base ring 12 to level the device over the component. Then the x- and y-axes are adjusted by turning the x- and y-knobs 40, 42 so that the pickup tube 76 is over the center of the component and the θ-angle is aligned with the component by turning the θ-ring 52. The pickup tube 76 is lowered by turning the z-knob 64 until the suction tip 74 contacts the component 84 and the vacuum is activated to grip the component 84. If the component 84 is soldered to the printed circuit board the solder must be heated as with a soldering iron or a hot air source until the bonds have softened. Then the component can be removed by lifting the pickup tube 76 by turning the z-knob 64. Once the component 84 is clear of the printed circuit board 82 the zθ assembly 68 can be lifted off the base 20 as shown in the drawing. At this point more solder paste may be added to the bonding pads on the printed circuit board 82 by stenciling or other techniques if it is desired. The defective component 84 is discarded or set aside by deactivating the vaccum, and the replacement component 84 is picked up by contacting it with the suction tip 74 and reactivating the vacuum. When the zθ assembly 68 is set back down on the base 20 the replacement component 84 should be very close to its final position 90. Any necessary adjustments should be made to the x- and y-axes and θ-angle to make sure that every contact pin of the component is precisely located over the corresponding bonding pad on the printed circuit board. The component 84 is lowered into place by turning the z-knob 64, and heat is applied to form the solder bonds. Once the bonds have cooled sufficiently, the vacuum is released and the device 20, 68 is removed from the printed circuit board 82.

One important modification to this procedure is possible if special tools have been modified so that they will mount on the base 20 in place of the zθ assembly 68. Such tools include soldering irons, hot air sources, IR soldering tools, UV adhesive curing tools and solder paste printing or stenciling apparati. This will give these tools the benefit of the precise and repeatable placement over the circuit component afforded by the component placement device.

CONCLUSION, RAMMIFICATIONS AND SCOPE

The present invention clearly fulfills the objectives of providing a small, accurate, inexpensive and easy to use component placement device for assisting in the assembly or repair of printed circuit boards. It also provides a means for manual manipulation, positioning, fixturing and placement of individual electronic components, devices or substrates onto a printed circuit board. The openness of the structure allows a clear, unobstructed view of the component being worked on. Since the device rests on or straddles the circuit board rather than holding it in a fixture, it can be used with any size or shape of PCB. While the present invention was conceived primarily for the placement of electronic components such as integrated circuits within a printed circuit board, the inventor foresees many other possible uses for the device with or without modification for the accurate placement of electronic, mechanical or other components within an assembly.

Although the description above contains many specificities, these should not be construed as limiting the scope of the invention, but merely as providing illustrations of some of the presently preferred embodiments of this invention. Many other variations of the invention are possible. For instance, although the component placement device has been illustrated as being made up of circular rings, it should be noted that the device could effectively be made in rectangular, triangular or other geometries. The device could even be with an open geometry, like a U, so that tools or components may be moved into the device from the side. Thus, in the broadest sense, the various parts may be referred to as the x-platform, the y-platform and the z-platform corresponding to the rings of the same designation. In an embodiment with noncircular geometry, it may be preferable to provide a rotating means other than a rotating ring. this rotation means may take the form of a bearing or pivot at the center of the hub that allows the vacuum gripper or other grasping device to rotate about the θ- or z-axis.

Thus the scope of the invention should be determined by the appended claims and their legal equivalents, rather than by the examples given.

I claim:

1. A component placement device comprising,
   a base having three or more legs extending downward therefrom, at least two of said legs being adjustable in length,
   an x-platform slidably mounted to said base so that said x-platform can move along an x-axis,
   an actuator adapted to move said x-platform in relation to said base along said x-axis,
   a y-platform slidably mounted to said x-platform so that said y-platform can move along a y-axis orthogonal to said x-axis,
   an actuator adapted to move said y-platform in relation to said x-platform along said y-axis,
   a z-platform removably mounted on said y-platform, having a grasping device and having an actuator adapted to move said grasping device along a z-axis orthogonal to said x-axis and said y-axis and having a means for rotating said grasping device about said z-axis.

2. The component placement device of claim 1 wherein said grasping device comprises a vacuum gripper.

3. The component placement device of claim 1 wherein one or more of said legs further comprises a vacuum gripping mechanism adapted to hold said device to a substrate.

4. The component placement device of claim 1 further comprising an optical device for vision assistance.

5. A component placement device, adapted to sit on or straddle a printed circuit board, comprising
   a base ring having three or more legs extending downward therefrom, at least two of said legs being adjustable in length,
   an x-ring disposed within said base ring, said x-ring being slidably mounted to said base ring in such a way that said x-ring can move along an x-axis,
   an actuator adapted to move said x-ring in relation to said base ring along said x-axis,
   a y-ring encircling said x-ring, said y-ring being slidably mounted to said x-ring in such a way that said y-ring can move along a y-axis orthogonal to said x-axis,
   an actuator adapted to move said y-ring in relation to said x-ring along said y-axis,
   and a θ-ring removably mounted on said y-ring, said θ-ring having mounted thereon a grasping device and having an actuator adapted to move said grasping device along a z-axis orthogonal to said x-axis and said y-axis, said grasping device being rotatable about said z-axis by rotating said θ-ring with respect to said y-ring.

6. The component placement device of claim 5 wherein said grasping device comprises a vacuum gripper.

7. The component placement device of claim 5 wherein one or more of said legs further comprises a vacuum gripping mechanism adapted to hold said device to a substrate.

8. The component placement device of claim 5 further comprising an optical device for vision assistance.

* * * * *